(12) United States Patent
Joo et al.

(10) Patent No.: US 10,600,580 B2
(45) Date of Patent: Mar. 24, 2020

(54) EXPLOSION-PROOF APPARATUS

(71) Applicant: SAMSUNG ELECTRONICS CO., LTD., Suwon-si (KR)

(72) Inventors: Sung Yong Joo, Hwaseong-si (KR); Sung Bum Jung, Yongin-si (KR); Won Myung Woo, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/886,375

(22) Filed: Feb. 1, 2018

(65) Prior Publication Data

US 2018/0226199 A1 Aug. 9, 2018

(30) Foreign Application Priority Data

Feb. 3, 2017 (KR) ........................ 10-2017-0015683

(51) Int. Cl.
*H01G 9/12* (2006.01)
*H01G 9/145* (2006.01)
(Continued)

(52) U.S. Cl.
CPC ............... *H01G 9/12* (2013.01); *H01G 2/06* (2013.01); *H01G 9/06* (2013.01); *H01G 9/10* (2013.01);
(Continued)

(58) Field of Classification Search
CPC ........ H01G 9/012; H01G 9/025; H01G 9/022; H01G 9/028; H01G 9/032; H01G 9/035; H01G 9/08; H01G 9/10; H01G 9/12
See application file for complete search history.

(56) References Cited

U.S. PATENT DOCUMENTS 3,277,553 A 10/1966 Wesolowski
4,771,363 A 9/1988 Kellerman
(Continued)

FOREIGN PATENT DOCUMENTS

GB 2459017 A 10/2009
JP 2000030981 * 1/2000
(Continued)

OTHER PUBLICATIONS

International Search Report (PCT/ISA/210) dated Jun. 15, 2018, issued by the International Searching Authority in counterpart International Application No. PCT/KR2018/001050.
(Continued)

*Primary Examiner* — Nguyen T Ha
(74) *Attorney, Agent, or Firm* — Sughrue Mion, PLLC

(57) ABSTRACT

An explosion-proof apparatus includes a stopper having a hollow cylindrical shape that is open at a first side and closed at a second side, and configured to be combined with an electrolytic condenser to surround an explosion-proof face of the electrolytic condenser and a lateral side connected to the explosion-proof face, through the first side, and a holder provided on the stopper to support the stopper. The first side of the stopper is separated from the explosion-proof face of the electrolytic condenser, a lateral side of the stopper has a stepped structure in which a periphery of a first region connecting to the first side is larger than a periphery of a second region connecting to the second side, and the holder is mounted on the stopper to surround at least part of the periphery of the second region of the stopper.

19 Claims, 15 Drawing Sheets

(51) Int. Cl.
*H01G 9/10* (2006.01)
*H01G 2/06* (2006.01)
*H05K 1/18* (2006.01)
*H01G 9/06* (2006.01)
*H05K 3/30* (2006.01)
*H01G 9/28* (2006.01)

(52) U.S. Cl.
CPC ............... *H01G 9/145* (2013.01); *H01G 9/28* (2013.01); *H05K 1/183* (2013.01); *H05K 3/306* (2013.01); *H05K 1/184* (2013.01); *H05K 3/301* (2013.01); *H05K 2201/09072* (2013.01); *H05K 2201/10015* (2013.01); *H05K 2201/10393* (2013.01); *H05K 2201/10583* (2013.01); *H05K 2201/10606* (2013.01); *H05K 2201/2036* (2013.01)

(56) References Cited

U.S. PATENT DOCUMENTS

| | | | | |
|---|---|---|---|---|
| 6,819,545 | B1* | 11/2004 | Lobo | H01G 9/12 361/15 |
| 8,310,813 | B2 | 11/2012 | Fujita et al. | |
| 8,391,017 | B2 | 3/2013 | McGregor et al. | |
| 8,693,168 | B1 | 4/2014 | Hagiwara et al. | |
| 8,755,170 | B2 | 6/2014 | Mori et al. | |
| 9,596,763 | B2 | 3/2017 | Nakamura | |
| 2006/0168787 | A1* | 8/2006 | Will | H01G 9/06 29/25.03 |
| 2009/0002942 | A1* | 1/2009 | Seifert | H01G 2/04 361/694 |
| 2009/0173721 | A1* | 7/2009 | Ueoka | B23K 26/03 219/121.64 |
| 2009/0257199 | A1 | 10/2009 | Henderson | |
| 2010/0232088 | A1 | 9/2010 | Fujita et al. | |
| 2010/0267252 | A1* | 10/2010 | Fujimoto | H01G 2/06 439/55 |
| 2010/0270645 | A1 | 10/2010 | McGregor et al. | |
| 2012/0081835 | A1* | 4/2012 | Shimizu | H01G 2/06 361/306.1 |
| 2012/0127633 | A1* | 5/2012 | Mori | H01G 9/0003 361/521 |
| 2013/0105210 | A1* | 5/2013 | Morita | H01G 11/76 174/260 |
| 2013/0140079 | A1 | 6/2013 | Nakamura | |
| 2014/0071589 | A1* | 3/2014 | Lin | H01G 9/012 361/523 |
| 2014/0104755 | A1 | 4/2014 | Hagiwara et al. | |
| 2014/0166499 | A1 | 6/2014 | Landskron et al. | |
| 2015/0287539 | A1* | 10/2015 | Ulherr | H01G 9/06 361/519 |
| 2015/0325383 | A1* | 11/2015 | Yoneda | H01G 11/26 361/512 |
| 2016/0295697 | A1* | 10/2016 | Nakamura | H05K 3/301 |
| 2017/0042032 | A1 | 2/2017 | Joo et al. | |

FOREIGN PATENT DOCUMENTS

| | | |
|---|---|---|
| JP | 2006-286969 A | 10/2006 |
| JP | 2012-69726 A | 4/2012 |
| JP | 2014-3193 A | 1/2014 |
| KR | 1020150116798 A | 10/2015 |

OTHER PUBLICATIONS

Written Opinion (PCT/ISA/237) dated Jun. 15, 2018, issued by the International Searching Authority in counterpart International Application No. PCT/KR2018/001050.

Communication dated Nov. 21, 2019 issued by the European Patent Office in counterpart European Application No. 18747445.7.

* cited by examiner

EXPLOSION-PROOF APPARATUS

CROSS-REFERENCE TO RELATED APPLICATION

This application claims the priority from Korean Patent Application No. 10-2017-0015683, filed on Feb. 3, 2017 in the Korean Intellectual Property Office, the entire disclosure of which is incorporated by reference herein.

BACKGROUND

1. Field

Example embodiments of the present disclosure relate to an explosion-proof apparatus for preventing collateral damage caused by explosion of an electrolytic condenser.

2. Description of the Related Art

An electrolytic condenser has an electrolyte in an airtight sealed casing. When the electrolytic condenser is defective, heat may be generated and gasify the electrolyte in the casing. The electrolyte gas may increase the pressure inside the electrolytic condenser and damage the casing of the electrolytic condenser. If the casing of the electrolytic condenser is damaged, the electrolyte may be scattered and cause damage to the surrounding components.

An electrolytic condenser in the related art may include a slit (an explosion-proof valve) on the top side of a casing to reduce a scattering area of an electrolyte when the casing is damaged. Accordingly, the electrolytic condenser in the related art may be configured such that the top side of the casing (hereinafter, referred to as an "explosion-proof face") may be damaged when the pressure inside the casing increases due to a failure in the electrolytic condenser.

SUMMARY

One or more example embodiments provide an explosion-proof apparatus for preventing the explosion-proof apparatus from being separated from an electrolytic condenser due to electrolyte gas when the electrolytic condenser explodes.

According to an aspect of an example embodiment, there is provided an explosion-proof apparatus including a stopper formed in a hollow cylindrical shape that is open at a first side and closed at a second side opposite to the first side, the stopper being configured to be combined with an electrolytic condenser by surrounding an explosion-proof face of the electrolytic condenser and a lateral side of the electrolytic condenser connected to the explosion-proof face, through the first side of the stopper, and a holder provided on the stopper and configured to support the stopper to be combined to the electrolytic condenser, wherein the first side of the stopper is spaced apart from the explosion-proof face of the electrolytic condenser, wherein a lateral side of the stopper is formed in a stepped structure and includes a periphery of a first region of the lateral side of the stopper connected to the first side of the stopper which is larger than a periphery of a second region of the lateral side of the stopper connected to the second side of the stopper, and wherein the holder is provided on the stopper to surround at least part of the periphery of the second region of the stopper.

The stopper may include at least one hole provided in at least one from among the lateral side and the second side of the stopper, wherein the at least one hole is smaller in size than the explosion-proof face of the electrolytic condenser.

The explosion-proof apparatus, wherein when the stopper includes a plurality of holes, and one of the plurality of holes may be larger in size than the other holes.

The electrolytic condenser, the stopper, and the holder may be configured to be provided in a positioning hole formed in a printed circuit board, and wherein the holder may include a body configured to surround the lateral side of the stopper, a plurality of first protrusions protruding away from the body and configured to be in contact with opposite sides of the positioning hole to apply a pressing force downward to the printed circuit board, and a plurality of second protrusions protruding away from of the body and configured to be in contact with the opposite sides of the positioning hole to apply a pressing force upward to the printed circuit board.

The plurality of first protrusions may be configured such that a first end of each of the plurality of the first protrusions furthest from the body is closer to the printed circuit board than a second end of each of the plurality of the first protrusions adjacent to the body when the electrolytic condenser, the stopper, and the holder being provided in the positioning hole.

The plurality of second protrusions may be configured to move toward each other while the electrolytic condenser, the stopper, and the holder are being positioned in the positioning hole, and to move away from each other in response to the electrolytic condenser, the stopper, and the holder are positioned in the positioning hole.

The plurality of second protrusions may include opposite end protrusions formed on opposite ends of the body and configured to be in contact with a first housing located on one side of the printed circuit board, and a central protrusion provided between the opposite end protrusions and configured to be in contact with a second housing located on another side the printed circuit board.

A first end of each of the plurality of second protrusions furthest away from the body may be wider than a second end of each of the plurality of second protrusions closest to the body.

The positioning hole may be formed in a cross shape, and the electrolytic condenser, the stopper, and the holder may be provided in the positioning hole in a longitudinal direction of the cross shape, and wherein the plurality of first protrusions and the plurality of second protrusions are configured to be in contact with opposite sides of the cross shape in a lateral direction of the cross shape when the electrolytic condenser, the stopper, and the holder are provided in the positioning hole.

The holder may further include at least one third protrusion protruding away from the body, and wherein an end of the at least one third protrusion may be configured to be in contact with at least one housing configured to secure the printed circuit board.

The body is formed in a U shape that surrounds a portion of the lateral side of the stopper, and wherein the at least one third protrusion includes a central protrusion provided between the plurality of second protrusions and configured to be in contact with a first housing located one side of the printed circuit board, and opposite end protrusions formed on opposite ends of the body and configured to be in contact with a second housing located on another side the printed circuit board.

The electrolytic condenser may include a spiral groove provided on the lateral side connected to the explosion-proof face of the electrolytic condenser, wherein the stopper includes a spiral protrusion corresponding to the spiral groove, and wherein the electrolytic condenser and the stopper are combined with each other by using the spiral groove and the spiral protrusion.

The explosion-proof apparatus may further include a cover member configured to surround the stopper and the lateral side of the electrolytic condenser not being combined with the stopper to secure the stopper to the electrolytic condenser.

The cover member may be coupled with a portion of the electrolytic condenser not being covered with cover vinyl, and is formed of a polymer.

The cover member may be further configured to surround a bottom side, opposite to the explosion-proof face, of the electrolytic condenser.

According to an aspect of another example embodiment, there is provided an explosion-proof apparatus including an electrolytic condenser including an explosion-proof face and a spiral groove provided on a lateral side of the electrolytic condenser connected to the explosion-proof face, and a stopper formed in a hollow cylindrical shape that is open at a first side and closed at a second side, opposite to the first side, and configured to be combined with the electrolytic condenser by surrounding the explosion-proof face of the electrolytic condenser and the lateral side of the electrolytic condenser, through the first side of the stopper, wherein a spiral protrusion corresponding to the spiral groove is provided on an inner side of the stopper, wherein the stopper is configured to be combined with the electrolytic condenser by engaging the spiral protrusion with the spiral groove, and wherein the first side of the stopper is spaced apart from the explosion-proof face of the electrolytic condenser.

The explosion-proof apparatus may further include a cover member configured to surround the stopper and the lateral side of the electrolytic condenser not being combined with the stopper, to secure the stopper to the electrolytic condenser.

The cover member may be coupled with the electrolytic condenser not being covered with cover vinyl, and is formed of a polymer.

The cover member may be further configured to surround a bottom side, opposite to the explosion-proof face, of the electrolytic condenser.

The stopper may include at least one hole provided in at least one of a lateral side and the second side of the stopper, and wherein the at least one hole is smaller in size than the explosion-proof face of the electrolytic condenser.

BRIEF DESCRIPTION OF THE DRAWINGS

The above and/or other aspects will become more apparent and readily appreciated from the following description of example embodiments, taken in conjunction with the accompanying drawings in which.

DETAILED DESCRIPTION

Figure 1A:
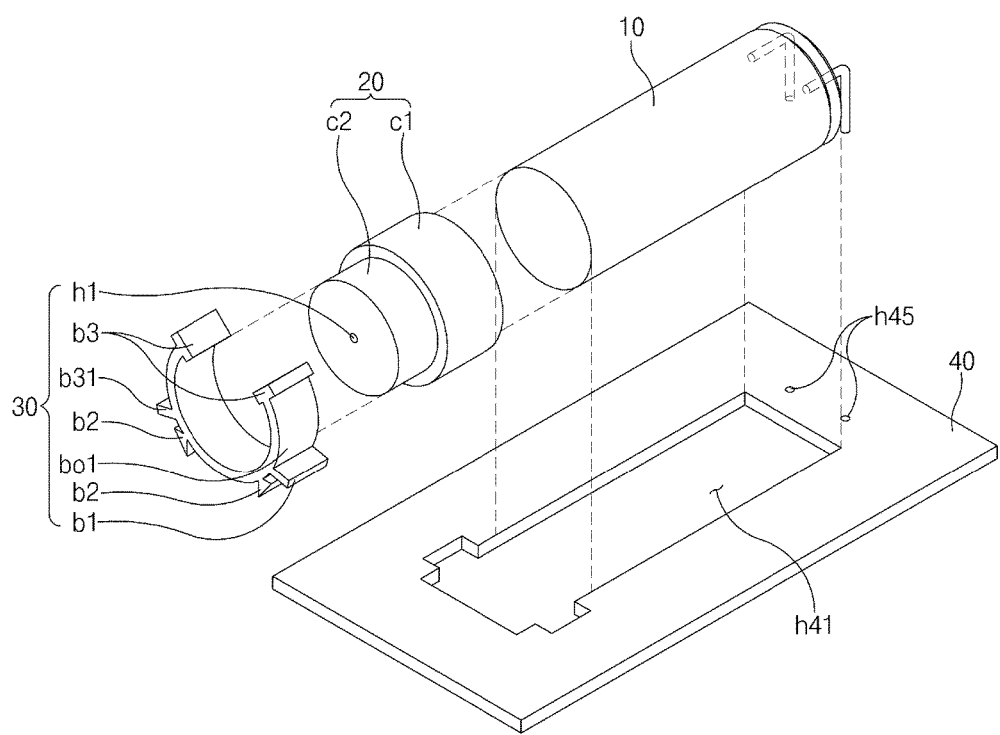
FIG. 1A is an exploded perspective view of an explosion-proof apparatus according to an example embodiment.

Hereinafter, example embodiments of the present disclosure will be described in greater detail with reference to the accompanying drawings. These example embodiments are described in sufficient detail to enable those skilled in the art to practice the present disclosure, and it is to be understood that the example embodiments are not intended to limit the present disclosure to particular modes of practice, and it is to be appreciated that all modification, equivalents, and alternatives that do not depart from the spirit and technical scope of the present disclosure are encompassed in the present disclosure.

In addition, like reference numerals or symbols shown in the drawings of the present disclosure indicate components or components that perform substantially the same function.

Throughout the specification, it will be understood that when a part "includes" or "comprises" an element, unless otherwise defined, the part may further include other elements, not excluding the other elements. It will be further understood that the singular forms "a," "an," and "the" include plural referents unless the context clearly dictates otherwise.

As used herein, the term "and/or" includes any and all combinations of one or more of the associated listed items. Expressions such as "at least one of" or "at least one from among" when preceding a list of elements, modify the entire list of elements and do not modify the individual elements of the list. For example, the expression, "at least one from among a, b, and c," should be understood as including only a, only b, only c, both a and b, both a and c, both b and c, or all of a, b, and c.

Terms including ordinals such as "first," "second" and the like used herein may be used to describe various elements, but the elements are not limited to the terms, and it is used only for the purpose of distinguishing one component from another. Terms such as "top side," "bottom side," "lateral side" etc., which are used in the following description are defined based on example embodiments as shown in the drawings, but a position of each component is not limited thereto.

FIG. 1A is an exploded perspective view of an explosion-proof apparatus according to an example embodiment.

Referring to FIG. 1A, according to an example embodiment, the explosion-proof apparatus may include a stopper 20 and a holder 30.

According to an example embodiment, the stopper 20 may be combined with the electrolytic condenser 10 to cover and surround a top side, an explosion-proof face, of the electrolytic condenser 10 and a portion of a lateral side of the electrolytic condenser 10 connected to the explosion-proof face. For example, the stopper 20 may have a hollow cylindrical shape that is open at a first side (e.g., the top side) and closed at a second side (e.g., the bottom side) opposite to the first side. The stopper 20 may be combined with the electrolytic condenser 10 through the first side of the stopper 20, and when the stopper 20 and the electrolytic condenser 10 are combined together, the inner side of the stopper 20 that is connected to the first side of the stopper 20 may be in contact with the lateral side of the electrolytic condenser 10 connected to the explosion-proof face.

According to an example embodiment, the stopper 20 may provide an inner space configured to collect an electrolyte flowing out of the electrolytic condenser 10 through the explosion-proof face. For example, when the stopper 20 is combined with the electrolytic condenser 10, the first side of the stopper 20 may be spaced apart from the explosion-proof face of the electrolytic condenser 10 by a predetermined distance, and thus, the inner space may be formed between the stopper 20 and the electrolytic condenser 10.

According to an example embodiment, a lateral side of the stopper 20 between the first side and second side of the stopper 20 may have a stepped structure. For example, the lateral side of the stopper 20 may be configured such that the periphery of a first region c1 connected to the first side of the stopper 20 is larger than the periphery of a second region c2 connected to the second side of the stopper 20, but example embodiments are not limited thereto. For example, the stopper 20 may be configured such that the periphery of the first region c1 being in contact with the lateral side of the electrolytic condenser 10 is larger than the periphery of the second region c2 that is not in contact with the lateral side of the electrolytic condenser 10. The holder 30 may be mounted on the second region c2. In the example embodiment, the stepped structure of the stopper 20 may expand the range in which the holder 30 supports the periphery of the stopper 20.

According to an example embodiment, the stopper 20 may have at least one effusion hole h1 configured to release electrolyte gas flowing out of the electrolytic condenser 10 through the explosion-proof face. The effusion hole h1 may be formed in at least one of the lateral side and the second side of the stopper 20. For example, the effusion hole h1 may be formed at one point of the second side of the stopper 20, for example, at the center of the second side, but example embodiments are not limited thereto. For example, the effusion hole h1 may be formed at an edge of the second side of the stopper 20. In an example embodiment, one effusion hole h1 may be formed in each of the second side and the lateral side of the stopper 20. In an example embodiment, the effusion hole h1 for releasing the electrolyte gas may be located away from a higher-pressure part to reduce collateral damage caused by the electrolyte gas.

In an example embodiment, the effusion hole h1 may be configured to distribute the pressure of the electrolyte gas flowing out of the electrolytic condenser 10. For example, the effusion hole h1 may be smaller in size than the explosion-proof face of the electrolytic condenser 10. Accordingly, the electrolyte gas flowing out of the electrolytic condenser 10 may collide with the second side of the stopper 20, and thus, the pressure of the electrolyte gas may decrease. In an example embodiment, the effusion hole h1 may have a shape having no corner (e.g., a circular shape, an oval shape, or the like). According to an example embodiment, a plurality of effusion holes h1 may be provided, in which case at least one of the plurality of effusion holes h1 may be larger in size than the other effusion holes. Accordingly, in the example embodiment, the electrolyte gas may be released to the outside through the larger effusion hole, and external cool air may be introduced into the stopper 20 through the other smaller effusion holes. In the example embodiment, the electrolyte gas may be more effectively released and circulated, and thus, clogging of the effusion holes may be reduced or prevented.

According to an example embodiment, the holder 30 may be mounted on the stopper 20 and configured to secure the electrolytic condenser 10 and the explosion-proof apparatus to the printed circuit board 40 on which the electrolytic condenser 10 is mounted. The holder 30 may be mounted on the stopper 20 to surround at least part of the periphery of the second region c2 of the stopper 20.

According to an example embodiment, the holder 30 may include a body bo1, a plurality of first protrusions b1, a plurality of second protrusions b2, and at least one third protrusion b3. The elements of the holder 30 will be described below.

The body bo1 may have a "U" shape and may surround at least part of the lateral side of the stopper 20, for example, part of the periphery of the second region c2 of the stopper 20. The plurality of first to third protrusions b1, b2, and b3 may be formed on the outer side of the body bo1.

When pins of the electrolytic condenser 10 are mounted in mounting holes h45 of the printed circuit board 40, and the electrolytic condenser 10 is positioned in a positioning hole h41 together with the holder 30, the plurality of first protrusions b1 on opposite sides of the positioning hole h41 of the printed circuit board 40 may apply a pressing force downward to the printed circuit board 40. The plurality of second protrusions b2 on the opposite sides of the positioning hole h41 may be in contact with the printed circuit board 40 and configured to apply a pressing force upward to the printed circuit board 40. The first and second protrusions b1 and b2 on one side of the positioning hole h41 and the first and second protrusions b1 and b2 on the opposite side of the positioning hole h41 may be paired with each other to apply the pressing force downward and upward to the printed circuit board 40. Accordingly, in an example embodiment, the holder 30, the stopper 20 on which the holder 30 is mounted, and the electrolytic condenser 10 combined with the stopper 20 may be more stably secured to the printed circuit board 40 by using the plurality of first and second protrusions b1 and b2. The plurality of second protrusions b2 may move toward each other while the explosion-proof apparatus is being positioned in the positioning hole h41, and may move away from each other after the explosion-proof apparatus is positioned in the positioning hole h41. Accordingly, in an example embodiment, the explosion-proof apparatus may be more stably coupled with the printed circuit board 40 after being positioned in the positioning hole h41 of the printed circuit board 40. A structure in which the explosion-proof apparatus and the printed circuit board 40 are coupled together through the plurality of first and second protrusions b1 and b2 will be described below with reference to FIG. 3 and FIG. 4.

According to an example embodiment, at least one third protrusion b3 may be formed to support the lateral side of the stopper 20 combined with the electrolytic condenser 10. For example, at least one third protrusion b3 may protrude inward and outward from opposite ends of the body bo1. A first end of the third protrusion b3 may protrude inward, for example, toward the center from the body bo1 to not disturb mounting of the holder 30 on the stopper 20 and may apply a pressing force to the stopper 20 to prevent or reduce the stopper 20 from being separated from the holder 30. A second end of the third protrusion b3 may protrude outward from the body bo1 to increase the pressing force of the first end of the third protrusion b3. In an example embodiment, at least one third protrusion b3 may be in contact with at least one housing for securing the printed circuit board 40. The at least one third protrusion b3 in contact with the housing may support the explosion-proof apparatus through the housing. The structure of the third protrusion b3 will be described below with reference to FIG. 3.

According to an example embodiment, the stopper 20 and the holder 30 may be formed of at least one material with higher heat-resistance. For example, the stopper 20 may be formed of aluminum, and the holder 30 may be formed of a flame retardant polymer. In another example, the stopper 20 and the holder 30 may be formed of a flame retardant polymer. Since the stopper 20 and the holder 30 may be separate elements in an example embodiment, the stopper 20 and the holder 30 may be more stably supported through the electrolytic condenser 10 and may be formed of various types of materials based on productivity, durability, manufacturing cost, and the like.

Figure 1B:
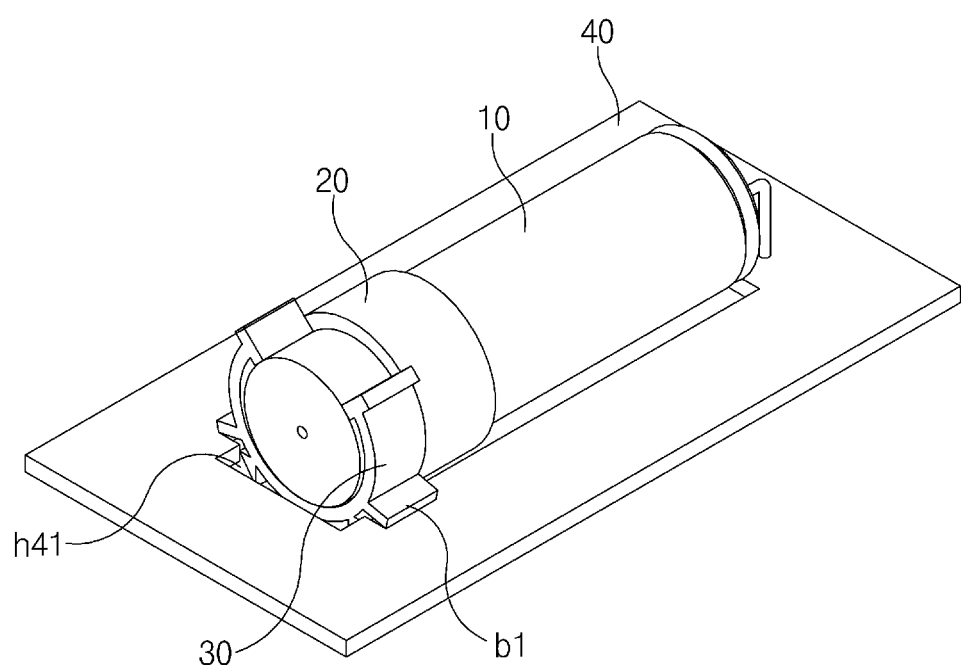
FIG. 1B is a perspective view of the explosion-proof apparatus secured to a printed circuit board according to an example embodiment.

FIG. 1B is a perspective view of the explosion-proof apparatus of FIG. 1 secured to the printed circuit board according to an example embodiment.

Referring to FIG. 1B, according to an example embodiment, the electrolytic condenser 10 combined with the explosion-proof apparatus may be mounted on the printed circuit board 40 and may be positioned in the positioning hole h41. For example, if the electrolytic condenser 10 is mounted and soldered on the printed circuit board 40, a body of the electrolytic condenser 10 combined with the explosion-proof apparatus and at least a part of the explosion-proof apparatus may be positioned in the positioning hole h41. In this case, the explosion-proof apparatus may support the opposite sides of the positioning hole h41 through the plurality of first and second protrusions b1 and b2 to stably secure the electrolytic condenser 10 to the positioning hole h41.

Figure 2:
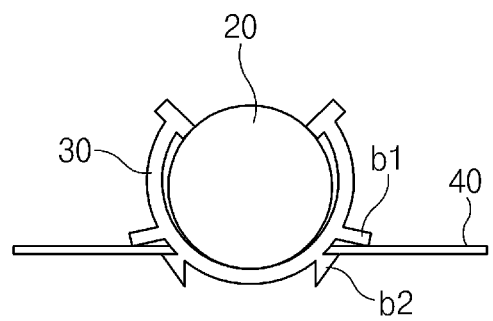
FIG. 2 is a top-view of the explosion-proof apparatus according to FIG. 1 coupled to the printed circuit board according to an example embodiment.

FIG. 2 is a top-view of the explosion-proof apparatus of FIG. 1 coupled to the printed circuit board according to an example embodiment. Hereinafter, a structure in which the first and second protrusions b1 and b2 of the explosion-proof apparatus and the printed circuit board 40 are coupled together will be described in detail with reference to FIG. 2.

Referring to FIG. 2, the plurality of first protrusions b1 and the plurality of second protrusions b2 may provide a structure for preventing or reducing the explosion-proof apparatus coupled to the printed circuit board 40 from being separated from the printed circuit board 40. For example, the plurality of first protrusions b1 may be configured such that the first end furthest from the body bo1 of the holder 30 is closer to the printed circuit board 40 than the second end adjacent to the body bo1 of the holder 30. In an example embodiment, the plurality of second protrusions b2 may be configured such that a region relatively far away from the body bo1 is wider than a region relatively close to the body bo1. Accordingly, in an example embodiment, the plurality of first protrusions b1 and the plurality of second protrusions b2 may be configured to exert force on the opposite sides of the positioning hole h41, which are inserted between the first and second protrusions b1 and b2, in different directions from the direction in which the holder 30 is inserted into the printed circuit board 40, thereby more stably securing the electrolytic condenser 10 to the printed circuit board 40.

Figure 3:
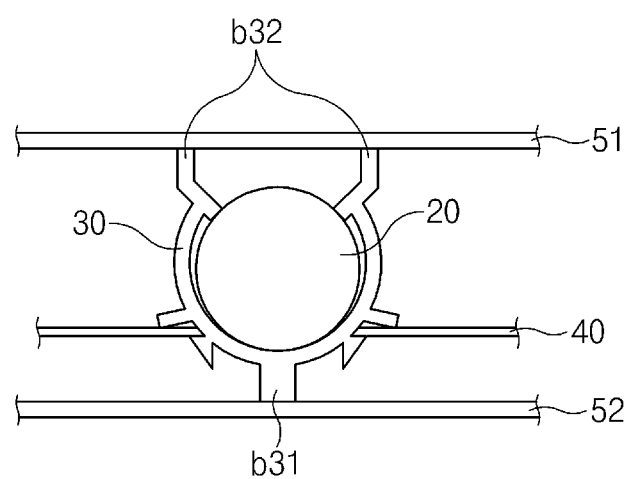
FIG. 3 is a sectional view illustrating a state in which the explosion-proof apparatus in FIG. 1 and a housing are coupled together according to an example embodiment.

FIG. 3 is a sectional view illustrating a state in which the explosion-proof and a housing are coupled together apparatus according to an example embodiment.

Referring to FIG. 3, according to an example embodiment, at least one third protrusion b3 may be in contact with one or more housings 51 and 52 to secure the printed circuit board 40 and may support the explosion-proof apparatus through the one or more housings 51 and 52. For example, at least one third protrusion b3 may be in contact with the first housing 51 (e.g., a front case) and the second housing 52 (e.g., a rear case).

Referring to FIG. 3, according to an example embodiment, the third protrusion b3 may include a central protrusion b31 and opposite end protrusions b32. The central protrusion b31 may protrude from the outside of the central portion of the body bo1 located between the plurality of second protrusions b2. A distal end of the central protrusion b31 furthest away from the body bo1 may be in contact with the second housing 52 to support the electrolytic condenser 10 through the contact surface of the second housing 52. The central protrusion b31 may be configured to increase the contact surface with the second housing 52. For example, the distal end of the central protrusion b31 that is in contact with the second housing 52 may have a flat shape. The opposite end protrusions b32 may protrude from the opposite ends of the body bo1. The opposite end protrusions b32 may be in contact with the first housing 51 to support the electrolytic condenser 10 through the contact surface of the first housing 51. The opposite end protrusions b32 may be configured to increase the contact surface with the first housing 51. For example, distal ends of the opposite end protrusions b31 that are in contact with the first housing 51 may have a flat shape.

Figure 4A:
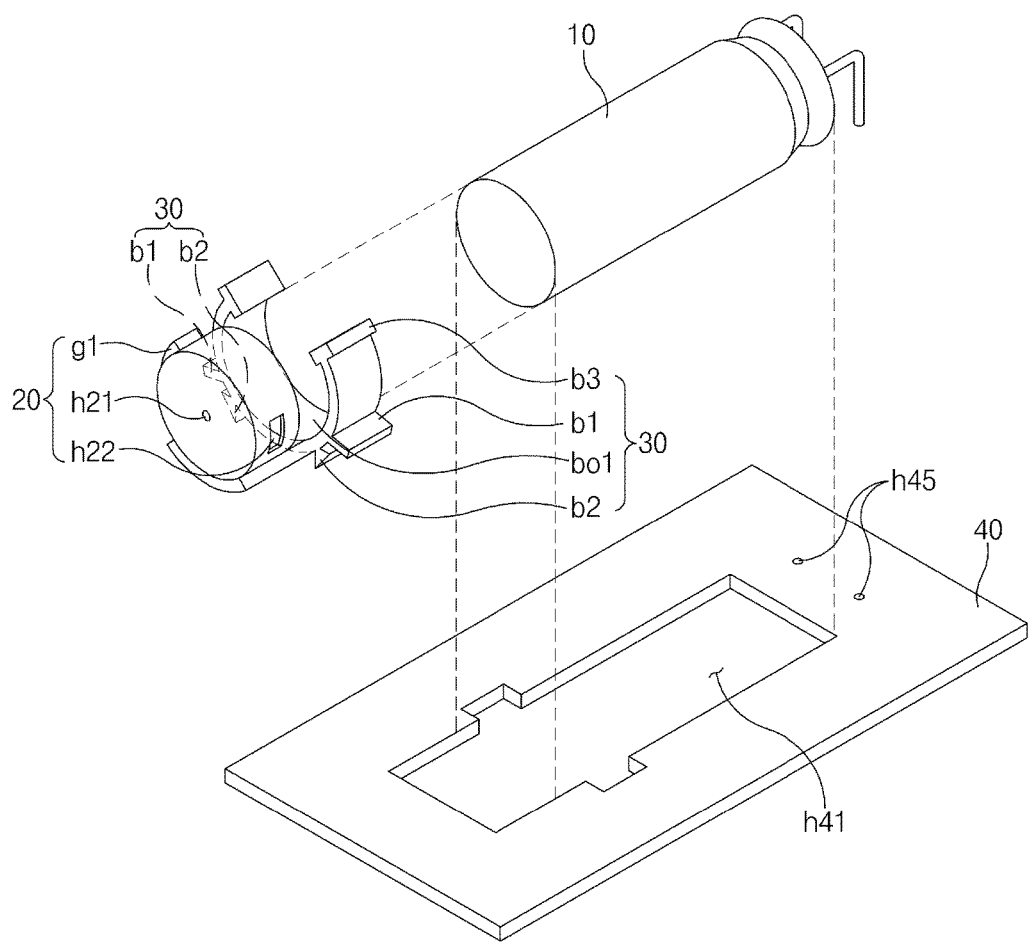
FIG. 4A illustrates an explosion-proof apparatus according to an example embodiment.

FIG. 4A illustrates an explosion-proof apparatus according to an example embodiment.

Referring to FIG. 4A, according to tan example embodiment, the explosion-proof apparatus may include the stopper 20 and the holder 30. The stopper 20 and the holder 30 of the explosion-proof apparatus according to an example embodiment may be integrated with each other. The coupling structure of the first to third protrusions b1, b2, and b3 in the example embodiment may be the same as, or similar to, that explained in relation to FIG. 2.

As illustrated in FIG. 4A, according to an example embodiment, the stopper 20 may be combined with the electrolytic condenser 10 to cover and surround the top side, explosion-proof face, of the electrolytic condenser 10 and the lateral side of the electrolytic condenser 10 that is connected to the explosion-proof face. For example, the stopper 20 may have a hollow cylindrical shape that is open at the first side (e.g., the top side) and closed at the second side (e.g., the bottom side) opposite to the first side. The stopper 20 may be combined with the electrolytic condenser 10 through the first side of the stopper 20, and when the stopper 20 and the electrolytic condenser 10 are combined together, the inner side of the stopper 20 that is connected to the first side may be in contact with the lateral side of the electrolytic condenser 10 that is connected to the explosion-proof face.

According to an example embodiment, the stopper 20 may provide an inner space configured to collect an electrolyte flowing out of the electrolytic condenser 10 through the explosion-proof face. For example, when the stopper 20 is combined with the electrolytic condenser 10, the first side of the stopper 20 may be spaced apart from the explosion-proof face of the electrolytic condenser 10 by a predetermined distance, and thus, the inner space may be formed between the stopper 20 and the electrolytic condenser 10.

As illustrated in FIG. 4A, according to an example embodiment, the stopper 20 may include an effusion hole h21, an effusion hole h22, and a collecting groove g1. The effusion hole h21, together with the effusion hole h22, may provide a passage for releasing an electrolyte gas flowing out of the electrolytic condenser 10 through the explosion-proof face. The effusion hole h21 may be formed at one point of the second side of the stopper 20, for example, at the center of the second side. The effusion hole h21 may have a predetermined shape, for example, a circular shape. The effusion hole h21 may be smaller in size than the explosion-proof face of the electrolytic condenser 10. The stopper 20 may include only one effusion hole h21, or may include a plurality of effusion holes h21. The effusion hole h22, together with the effusion hole h21, may provide a passage to release the electrolyte gas. The effusion hole h22 may be formed in a predetermined shape (e.g., a rectangular shape) in the second side and/or lateral side of the stopper 20. For example, the effusion hole h22 may be located on a lateral side of the stopper 20 opposite to the collecting groove g1. The collecting groove g1 may communicate with the inner space of the stopper 20 and may provide a region configured to collect the electrolyte flowing out of the electrolytic condenser 10 through the explosion-proof face of the electrolytic condenser 10. The collecting groove g1 may have a predetermined shape (e.g., a curved rectangular parallelepiped shape) protruding from the outside of the stopper 20. The collecting groove g1 may provide a region in which the electrolyte is collected in a direction different from that in which the electrolyte gas is released.

According to an example embodiment, the holder 30 may secure the explosion-proof apparatus combined with the electrolytic condenser 10 to the printed circuit board 40 on which the electrolytic condenser 10 is mounted. For example, if the explosion-proof apparatus and the electrolytic condenser 10 combined with each other are positioned in the positioning hole h41 of the printed circuit board 40, the holder 30 may support opposite sides of the positioning hole h41 to secure the explosion-proof apparatus and the electrolytic condenser 10 to the printed circuit board 40.

According to an example embodiment, the holder 30 may include the body bo1, the plurality of first protrusions b1, the plurality of second protrusions b2, and the at least one third protrusion b3. The elements of the holder 30 will be described below.

The body bo1 may surround at least a part of the outside of the electrolytic condenser 10. For example, the body bo1 may have a "U" shape, and the inner side of the body bo1 may be in contact with the outside of the electrolytic condenser 10 while surrounding the outside of the electrolytic condenser 10.

The plurality of first protrusions b1 and the plurality of second protrusions b2 may protrude from the outside of the body bo1 to secure the electrolytic condenser 10 combined with the explosion-proof apparatus to the printed circuit board 40. The plurality of first protrusions b1 may apply a pressing force downward to the printed circuit board 40, and the plurality of second protrusions b2 may apply a pressing force upward to the printed circuit board 40. The plurality of second protrusions b2 may move toward each other while the explosion-proof apparatus is being positioned in the positioning hole h41, and may move away from each other after the explosion-proof apparatus is positioned in the positioning hole h41. The third protrusion b3 may be in contact with housings 51 and 52 (FIG. 3) to support the explosion-proof apparatus through the contact surfaces with the housings 51 and 52. The plurality of first protrusions b1 and the plurality of second protrusions b2 may provide a structure for preventing or reducing the explosion-proof apparatus coupled to the printed circuit board 40 from being separated from the printed circuit board 40.

According to an example embodiment, the at least one third protrusion b3 may be formed to support the outside of the stopper 20 combined with the electrolytic condenser 10. For example, the at least one third protrusion b3 may protrude inward and outward from opposite ends of the body bo1. The first end of the third protrusion b3 may protrude inward, for example, toward the center from the body bo1 to not disturb mounting of the holder 30 on the stopper 20 and may apply a pressing force to the stopper 20 to prevent or reduce the stopper 20 from being separated from the holder 30. The second end of the third protrusion b3 may protrude outward from the body bo1 to increase the pressing force of the first end of the third protrusion b3. In an example embodiment, the at least one third protrusion b3 may be in contact with at least one housing for securing the printed circuit board 40. The at least one third protrusion b3 in contact with the at least one housing may support the explosion-proof apparatus through the at least one housing 51 and 52.

According to an example embodiment, the stopper 20 and the holder 30 may be integrated with each other. For example, the holder 30 may be connected to the lateral side of the stopper 20, and the stopper 20 and the holder 30 may be formed of a higher heat-resistance material, for example, a flame retardant polymer.

Figure 4B:
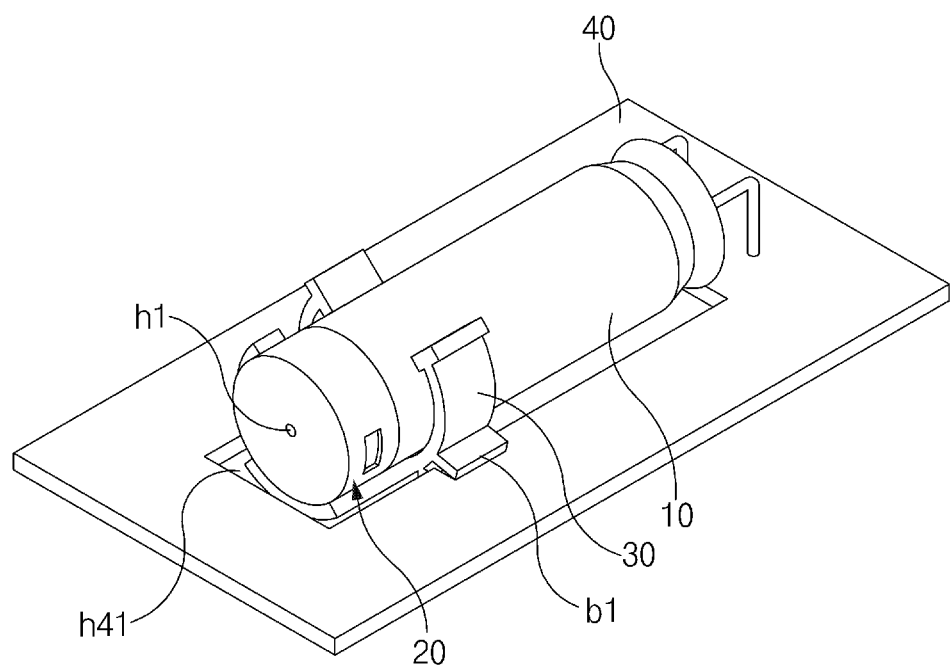
FIG. 4B is a perspective view of the explosion-proof apparatus according to FIG. 4A secured to a printed circuit board according to an example embodiment.

FIG. 4B is a perspective view of the explosion-proof apparatus of FIG. 4A secured to the printed circuit board according to an example embodiment.

Referring to FIG. 4B, according to an example embodiment, the electrolytic condenser 10 combined with the explosion-proof apparatus may be mounted on the printed circuit board 40 and may be positioned in the positioning hole h41. For example, if the electrolytic condenser 10 is mounted and soldered on the printed circuit board 40, the explosion-proof apparatus and at least a part of the electrolytic condenser 10 may be positioned in the positioning hole h41. According to an example embodiment, the explosion-proof apparatus may support the opposite sides of the positioning hole h41 through the plurality of first and second protrusions b1 and b2.

Hereinafter, an explosion-proof apparatus according to an example embodiment will be described with reference to FIG. 5 and FIG. 6.

Figure 5:
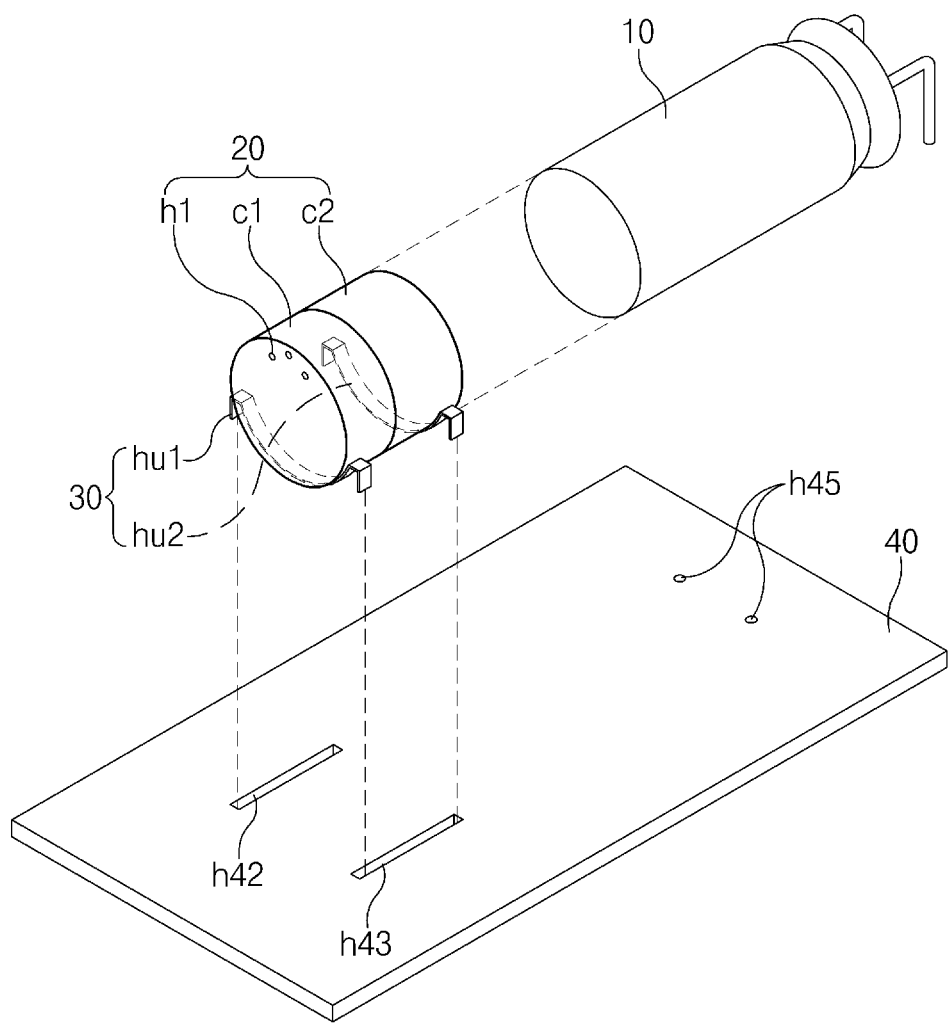
FIG. 5 is a perspective view of an explosion-proof apparatus according to an example embodiment.

FIG. 5 is a perspective view of the explosion-proof apparatus according to an example embodiment.

Referring to FIG. 5, according to an example embodiment, the explosion-proof apparatus may include the stopper 20 and the holder 30. The explosion-proof apparatus according to an example embodiment may be used where the electrolytic condenser 10 is mounted and located on the printed circuit board 40.

As illustrated in FIG. 5, according to an example embodiment, the stopper 20 may have a hollow cylindrical shape that is open at the first side (e.g., the top side) and closed at the second side (e.g., the bottom side) opposite to the first side. The stopper 20 may be combined with the electrolytic condenser 10 through the first side of the stopper 20, and when the stopper 20 and the electrolytic condenser 10 are combined together, the inner side of the stopper 20 that is connected to the first side may be in contact with the lateral side of the electrolytic condenser 10 that is connected to the explosion-proof face.

According to an example embodiment, the stopper 20 may provide an inner space configured to collect an electrolyte flowing out of the electrolytic condenser 10 through the explosion-proof face. For example, when the stopper 20 is combined with the electrolytic condenser 10, the first side of the stopper 20 may be spaced apart from the explosion-proof face of the electrolytic condenser 10 by a predetermined distance, and thus, the inner space may be formed between the stopper 20 and the electrolytic condenser 10.

According to an example embodiment, the lateral side of the stopper 20 may have a stepped structure. For example, the lateral side of the stopper 20 may be configured such that the periphery of the first region c1 connected to the first side of the stopper 20 is larger than the periphery of the second region c2 connected to the second side of the stopper 20, but example embodiments are not limited thereto. For example, the stopper 20 may be configured such that the periphery of the first region c1 in contact with the lateral side of the electrolytic condenser 10 is larger than the periphery of the second region c2 that is not in contact with the lateral side of the electrolytic condenser 10. The holder 30 may be mounted on the second region c2. In another example, a region (e.g., a protrusion) having a different diameter from the remaining region may be formed on the inside of the stopper 20 between the first side and the second side to ensure separation between the first side of the stopper 20 and the explosion-proof face of the electrolytic condenser 10. In an example embodiment, the stepped structure of the stopper 20 may expand the range in which the holder 30 supports the periphery of the stopper 20. Furthermore, in an example embodiment, the stepped structure of the stopper 20 may ensure the inner space between the explosion-proof face of the electrolytic condenser 10 and the stopper 20.

According to an example embodiment, the stopper 20 may have at least one effusion hole h1 configured to release electrolyte gas flowing out of the electrolytic condenser 10 through the explosion-proof face. The effusion hole h1 may be formed in at least one of the lateral side and the second side of the stopper 20. For example, the effusion hole h1 may be formed at one point of the second side of the stopper 20, for example, at the center of the second side, but example embodiments are not limited thereto. For example, the effusion hole h1 may be formed at the center of the second side of the stopper 20 or at an edge of the second side of the stopper 20. In another example, one effusion hole h1 may be formed in the second side and the lateral side of the stopper 20. In an example embodiment, the effusion hole h1 for releasing the electrolyte gas may be located away from a higher-pressure part to reduce collateral damage caused by the electrolyte gas.

In an example embodiment, the effusion hole h1 may be configured to distribute the pressure of the electrolyte gas flowing out of the electrolytic condenser 10. For example, the effusion hole h1 may be smaller in size than the explosion-proof face of the electrolytic condenser 10. Accordingly, the electrolyte gas flowing out of the electrolytic condenser 10 may collide with the second side of the stopper 20, and thus, the pressure of the electrolyte gas may decrease. In another example, the effusion hole h1 may have a shape having no corner (e.g., a circular shape, an oval shape, or the like). A plurality of effusion holes h1 may be provided, in which case at least one of the plurality of effusion holes h1 may be larger in size than the other effusion holes. Accordingly, in an example embodiment, the electrolyte gas may be released to the outside through the larger effusion hole, and external cool air may be introduced through the other smaller effusion holes. In an example embodiment, the electrolyte gas may be more effectively released and circulated, and thus, clogging of the effusion holes may be prevented or reduced.

According to an example embodiment, the holder 30 may be coupled with the printed circuit board 40 to secure the stopper 20 to the printed circuit board 40. Referring to FIG. 5, the holder 30 may include first and second stopping members hu1 and hu2. A portion (e.g., a middle portion) of each stopping member hu1 or hu2 may be secured to the outside of the stopper 20, and opposite ends of the stopping member hu1 or hu2 may be inserted into fixing holes h42 and h43 formed in the printed circuit board 40. The opposite ends of the stopping member hu1 or hu2 may be soldered after being inserted into the fixing holes h42 and h43 of the printed circuit board 40. As illustrated in FIG. 5, the opposite ends of the stopping member hu1 or hu2 may have a straight structure.

According to an example embodiment, the opposite ends of the stopping member hu1 or hu2 may be inserted into the plurality of fixing holes h42 and h43 formed in the printed circuit board 40, or soldered after being inserted into the fixing holes h42 and h43, to secure the electrolytic condenser 10 to the printed circuit board 40. The plurality of fixing holes h42 and h43 may have a shape that is able to be coupled with the opposite ends of the first and second stopping members hu1 and hu2. For example, as illustrated in FIG. 5, the plurality of fixing holes h42 and h43 may be two rectangular holes formed in the longitudinal direction of the stopper 20, and the size of each fixing hole may correspond to the sum of the interval between the first and second stopping members hu1 and hu2 and the width of the first and second stopping members hu1 and hu2. A first end of the first stopping member hu1 and a first end of the second stopping member hu2 may be inserted into the first fixing hole h42, and a second end of the first stopping member hu1 and a second end of the second stopping member hu2 may be inserted into the second fixing hole h43, but example embodiments are not limited thereto. For example, the plurality of fixing holes h42 and h43 may be four rectangular holes into which the first and second ends of the first stopping member hu1 and the first and second ends of the second stopping member hu2 are inserted, respectively. In this case, the size of the plurality of fixing holes h42 and h43 may correspond to the width of each end of the first and second stopping members hu1 and hu2.

According to an example embodiment, the holder 30 may be formed of a material, such as aluminum, which is able to be joined with solder. The stopper 20 may be formed of a material, such as aluminum, which is able to be bonded or welded to the holder 30.

Figure 6:
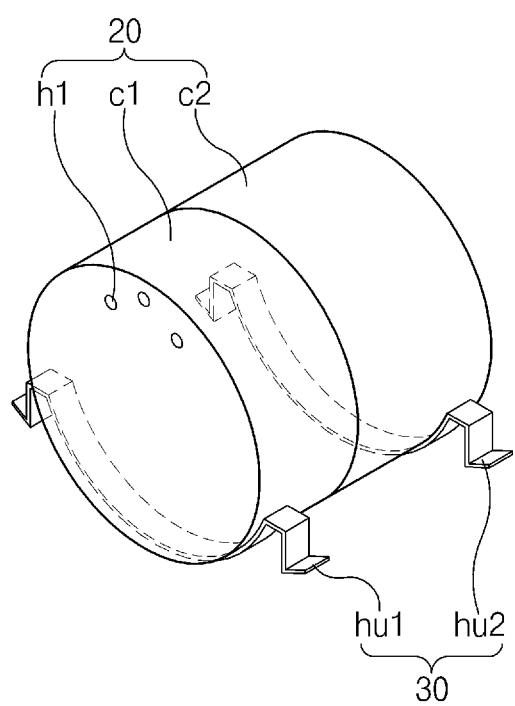
FIG. 6 is a perspective view of an explosion-proof apparatus according to an example embodiment.

FIG. 6 is a perspective view of an explosion-proof apparatus according to an example embodiment.

Referring to FIG. 6, according to an example embodiment, the explosion-proof apparatus may include the stopper 20 and the holder 30.

Referring to FIG. 6, the opposite ends of the stopping members hu1 and hu2 may have a "V" shape. Referring to FIG. 6, if the opposite ends of the stopping members hu1 and hu2 are inserted into the fixing holes h42 and h43 of the printed circuit board 40, the holder 30 may be prevented from being easily separated from the fixing holes h42 and h43, due to the characteristic of the "V" shape. Although FIG. 6 illustrates that both the first stopping member hu1 and the second stopping member hu2 have a v-shaped end structure, one of the first and second stopping members hu1 and hu2, for example, only the stopping member adjacent to the second side of the stopper 20 may have a v-shaped end structure.

Hereinafter, an explosion-proof apparatus according to an example embodiment will be described with reference to FIG. 7A and FIG. 7B.

Figure 7A:
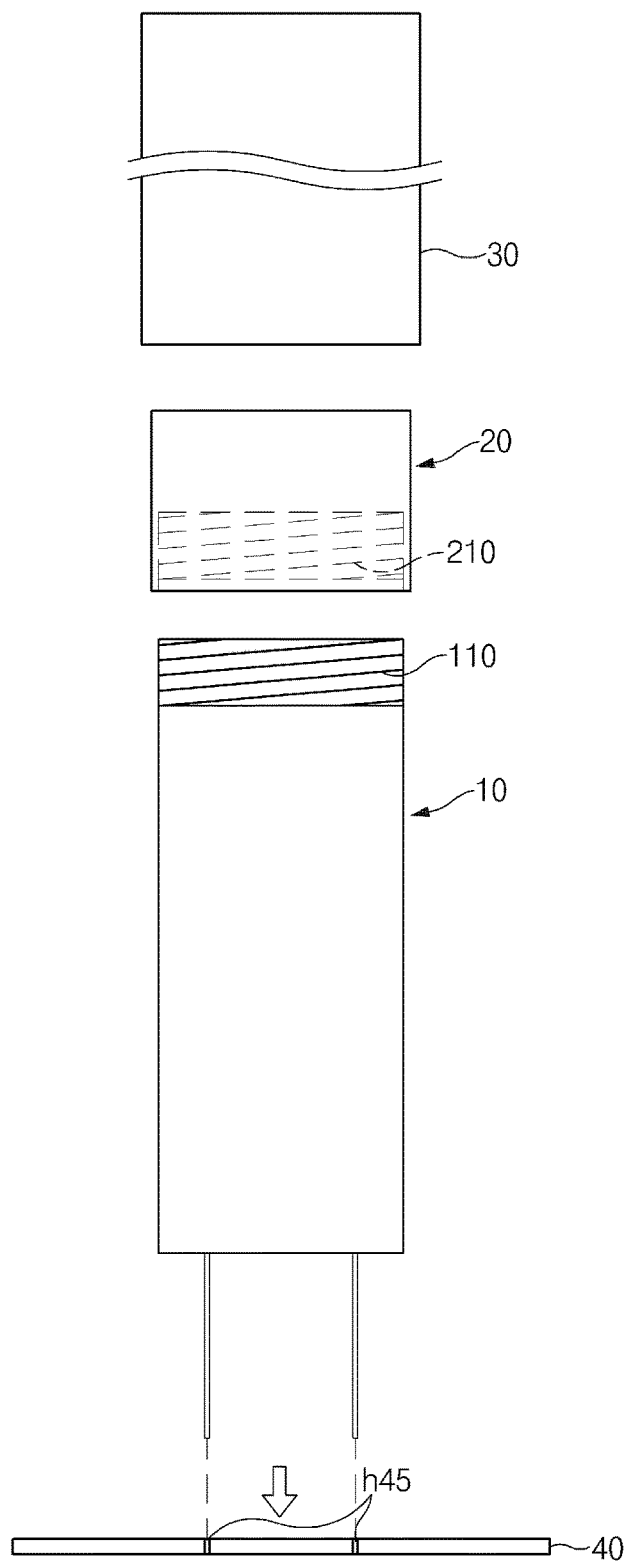
FIG. 7A is an exploded side view of an explosion-proof apparatus according to an example embodiment.
Figure 7B:
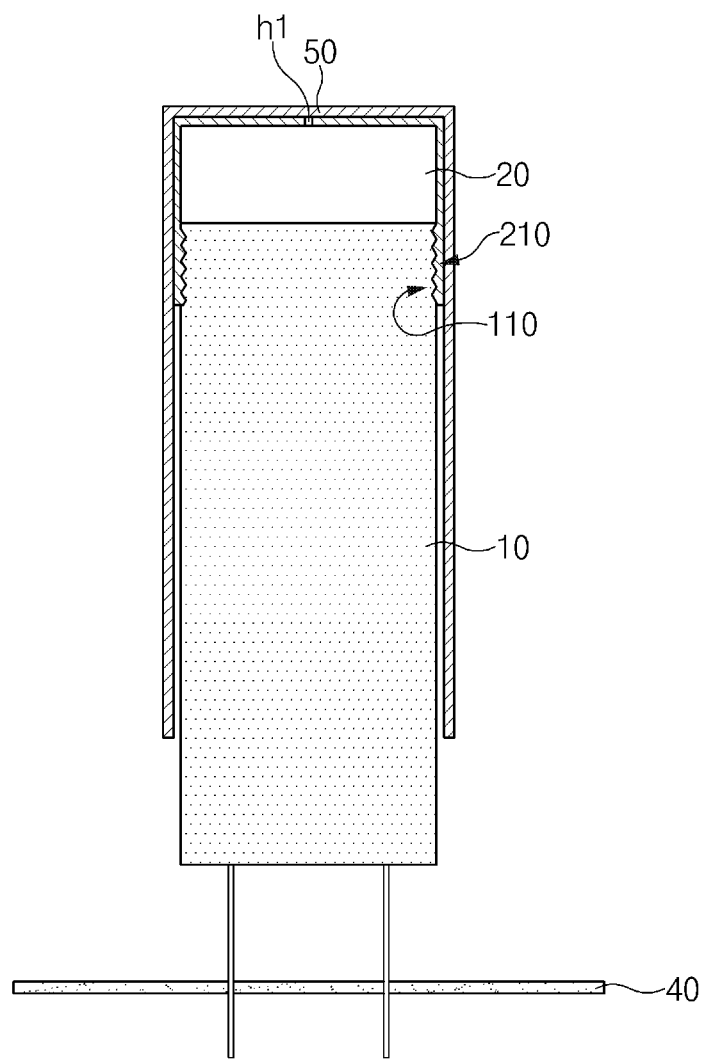
FIG. 7B is a sectional view of the explosion-proof apparatus according to an example embodiment.

FIG. 7A is an exploded side view of an explosion-proof apparatus according to an example embodiment, and FIG. 7B is a sectional view of the explosion-proof apparatus according to an example embodiment.

Referring to FIG. 7A, according to an example embodiment, the explosion-proof apparatus may include the electrolytic condenser 10, the stopper 20, and a cover member 50, which may be applied to the vertical electrolytic condenser 10 vertically mounted on the printed circuit board 40.

According to an example embodiment, the electrolytic condenser 10 may have a spiral groove 110 formed on the lateral side thereof. For example, the spiral groove 110 may be formed on the lateral side of the electrolytic condenser 10 that is connected to the explosion-proof face of the electrolytic condenser 10.

According to an example embodiment, the stopper 20 may be combined with the electrolytic condenser 10 to cover and surround the explosion-proof face of the electrolytic condenser 10 and the lateral side of the electrolytic condenser 10 that is connected to the explosion-proof face. For example, the stopper 20 may have a hollow cylindrical shape that is open at the first side and closed at the second side opposite to the first side. The stopper 20 may cover and surround the explosion-proof face of the electrolytic condenser 10 and the lateral side of the electrolytic condenser 10, which is connected to the explosion-proof face, through the first side. In an example embodiment, the stopper 20 may have an inner periphery greater than the periphery of the lateral side of the electrolytic condenser 10 to include the explosion-proof face of the electrolytic condenser 10 and the lateral side of the electrolytic condenser 10 therein.

According to an example embodiment, the stopper 20 may have a spiral protrusion 210 formed on the inside thereof to correspond to the spiral groove 110. The stopper 20 may be combined with the electrolytic condenser 10 by engaging the spiral protrusion 210 with the spiral groove 110.

According to the example embodiment, the stopper 20 may be formed of a material that is less likely to deform the spiral groove 110 or a material having higher durability. For example, the stopper 20 may be formed of aluminum.

Referring to FIG. 7B, according to an example embodiment, the cover member 50 may have a hollow cylindrical shape that is open at a first side and closed at a second side opposite to the first side, and may cover and surround the stopper 20 and the periphery of the electrolytic condenser 10 not being combined with the stopper 20. The cover member 50 may have a hollow cylindrical shape that is open at the first side and partially open at the second side, and may surround the periphery of the electrolytic condenser 10 not being combined with the stopper 20, the stopper 20, and the bottom side of the electrolytic condenser 10. The cover member 50 may secure the stopper 20 to the electrolytic condenser 10.

According to an example embodiment, the cover member 50 may be a polymer material on which specification information of the electrolytic condenser 10 is marked. Accordingly, in an example embodiment, conventional cover vinyl of the electrolytic condenser 10 may be replaced with the cover member 50 of, for example, a polymer material according to an example embodiment.

Hereinafter, a gas release direction depending on the position of an effusion hole, according to example embodiments, will be described with reference to FIG. 8A and FIG. 8B.

Figure 8A:
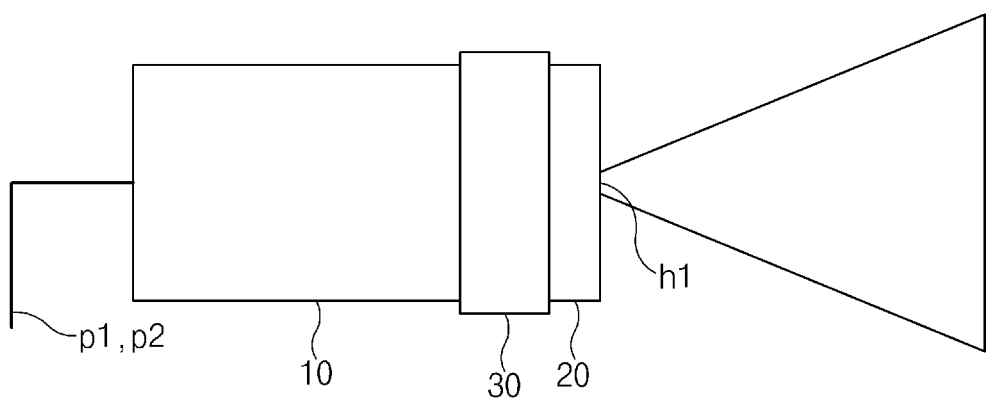
FIG. 8A illustrates an electrolyte-gas release direction of an explosion-proof apparatus that has an effusion hole formed in a second side of a stopper according to an example embodiment.

FIG. 8A illustrates an electrolyte-gas release direction of an explosion-proof apparatus according to an example embodiment that has an effusion hole formed in a second side of a stopper.

Referring to FIG. 8A, according to an example embodiment, when the effusion hole h1 is located in the second side (e.g., the top side) of the stopper 20, an electrolyte gas flowing out of the electrolytic condenser 10 through the explosion-proof face may be released toward the second side of the stopper 20, and may be spread out away from the stopper 20.

Figure 8B:
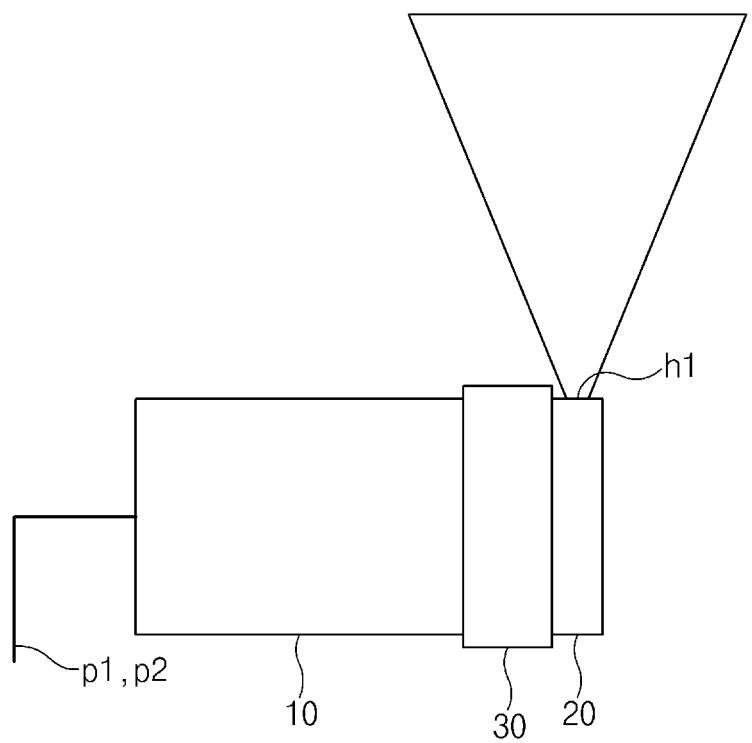
FIG. 8B illustrates an electrolyte-gas release direction of an explosion-proof apparatus that has an effusion hole formed in a lateral side of a stopper according to an example embodiment.

FIG. 8B illustrates an electrolyte-gas release direction of an explosion-proof apparatus according to an example embodiment that has an effusion hole formed in a lateral side of a stopper 20.

Referring to FIG. 8B, according to an example embodiment, when the effusion hole h1 is located in the lateral side of the stopper 20, an electrolyte gas flowing out of the electrolytic condenser 10 through the explosion-proof face may be released toward the lateral side of the stopper 20 and may be spread out away from the stopper 20.

In an example embodiment, a direction in which an electrolyte gas is released may be relatively accurately inferred, and therefore collateral damage caused by the electrolyte gas may be reduced by locating a higher-pressure part away from the effusion hole h1 of the stopper 20.

Hereinafter, a plurality of effusion holes according to an example embodiment will be described with reference to FIG. 9A and FIG. 9B.

Figure 9A:
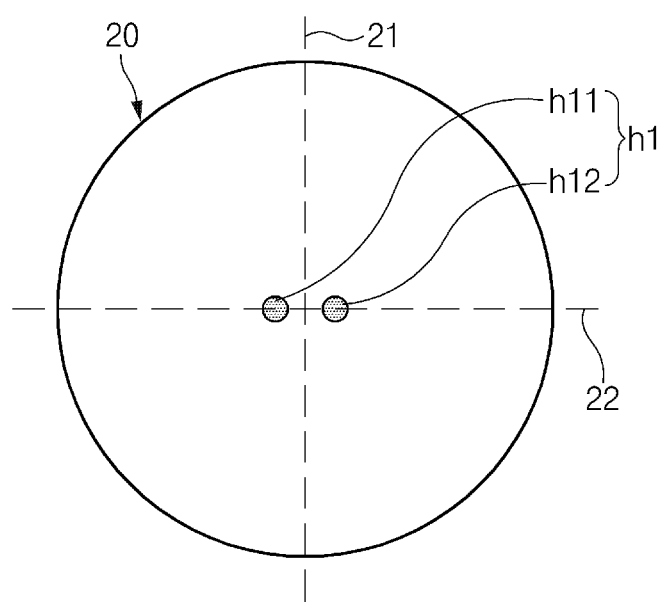
FIG. 9A is a view illustrating an top-view of an explosion-proof apparatus that has effusion holes formed in a top side of a stopper according to an example embodiment.

FIG. 9A is a view illustrating an top-view of an explosion-proof apparatus according to an example embodiment that has effusion holes formed in a top side of a stopper.

Referring to FIG. 9A, according to an example embodiment, a plurality of effusion holes h1 may be formed in the top side of the stopper 20. For example, a plurality of effusion holes h11 and h12 may be located on a second line 22 to be bilaterally symmetric with respect to a first line 21. The first line 21 may pass through the center of the second side (the top side) of the stopper 20. The second line 22 may pass through the center of the second side (the top side) of the stopper 20 and may be perpendicular to the first line 21. However, example embodiments are not limited thereto. For example, the plurality of effusion holes h11 and h12 may be located in a different region of the second side of the stopper 20 (e.g., a region between the center of the second side and the lateral side of the stopper 20).

Figure 9B:
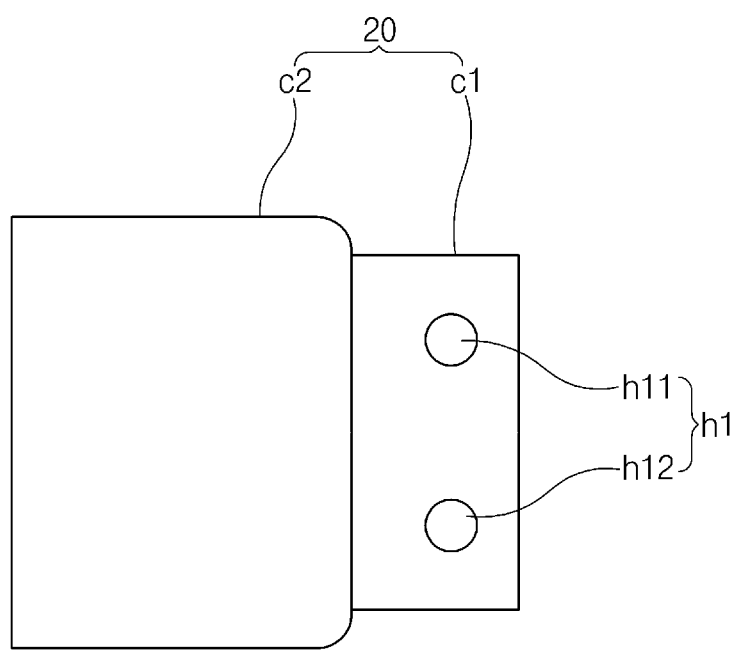
FIG. 9B is a view illustrating an lateral-view of an explosion-proof apparatus that has effusion holes formed in a lateral side of a stopper according to an example embodiment.

FIG. 9B is a view illustrating an lateral-view of an explosion-proof apparatus according to an example embodiment that has effusion holes formed in a lateral side of a stopper.

Referring to FIG. 9B, according to an example embodiment, a plurality of effusion holes h1 may be formed in the lateral side of the stopper 20. For example, a plurality of effusion holes h11 and h12 may be formed along the periphery of a middle portion of the lateral side of the stopper 20. However, example embodiments are not limited thereto. For example, the plurality of effusion holes h11 and h12 may be formed in the second side and the lateral side of the stopper 20.

Although FIG. 9A and FIG. 9B illustrate that the explosion-proof apparatus has the two effusion holes h11 and h12, the explosion-proof apparatus may have three or more effusion holes h1.

Figure 10:
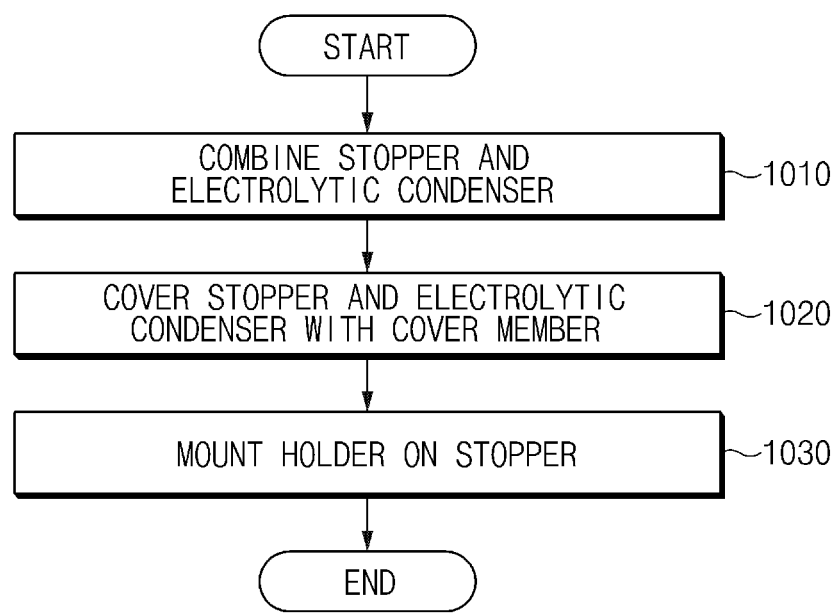
FIG. 10 is a flowchart illustrating a method for manufacturing an explosion-proof apparatus according to an example embodiment.

FIG. 10 is a flowchart illustrating a method for manufacturing an explosion-proof apparatus according to an example embodiment.

Referring to FIG. 10, in operation 1010, the stopper 20 may be combined with the electrolytic condenser 10. For example, the stopper 20 may be combined with the electrolytic condenser 10 by inserting the explosion-proof face of the electrolytic condenser 10 into the stopper 20 in the direction from the first side to the second side of the stopper 20.

In operation 1020, the electrolytic condenser 10 combined with the stopper 20 may be covered with the cover member 50. The cover member 50 may replace cover vinyl of the electrolytic condenser 10. For example, the cover member 50 may have a hollow cylindrical shape that is open at the first side and closed at the second side opposite to the first side, and may be mounted on the electrolytic condenser 10 in the direction from the top side to the bottom side of the electrolytic condenser 10 not being covered with cover vinyl. As a result, the cover member 50 may cover and surround the stopper 20 and the periphery of the electrolytic condenser 10 not being combined with the stopper 20 to secure the stopper 20 to the electrolytic condenser 10. The cover member 50 may additionally cover and surround the bottom side of the electrolytic condenser 10. In this case, the cover member 50 may more stably secure the stopper 20 to the electrolytic condenser 10. The cover member 50 may be formed of a polymer material on which specification information of the electrolytic condenser 10 is marked. In the case where the electrolytic condenser 10 covered with cover vinyl is used, operation 1020 may be omitted. Alternatively, operation 1020 may be performed irrespective of the cover vinyl of the electrolytic condenser 10.

In operation 1030, the holder 30 may be mounted on the second region of the stopper 20 that has a shorter circumference, with the cover member 50 mounted on the stopper 20. If the electrolytic condenser 10 is positioned in the positioning hole h41 of the printed circuit board 40, the explosion-proof apparatus configured through operations 1010 to 1030 may be positioned in the positioning hole h41 to secure the electrolytic condenser 10 to the printed circuit board 40 through the opposite sides of the positioning hole h41.

Operations performed by a module, a program module, or other elements according to various embodiments may be executed sequentially, in parallel, repeatedly, or in a heuristic method. In addition, some of the operations may be executed in different sequences or may be omitted. Alternatively, other operations may be added. Example embodiments of the present disclosure are provided to describe technical details of the present disclosure and to help the understanding of the present disclosure, and are not intended to limit the scope of the present disclosure. Therefore, it should be construed that all modifications and changes or various other embodiments based on the technical idea of the present disclosure fall within the scope of the present disclosure.

While the present disclosure has been shown and described with reference to various example embodiments thereof, it will be understood by those skilled in the art that various changes in form and details may be made therein without departing from the spirit and scope of the present disclosure as defined by the appended claims and their equivalents.

What is claimed is:

1. An explosion-proof apparatus comprising:
    a stopper having a hollow cylindrical shape that is open at a first side and closed at a second side opposite to the first side, the stopper being configured to be combined with an electrolytic condenser by surrounding a top side of the electrolytic condenser and a lateral side of the electrolytic condenser connected to the top side, through the first side of the stopper; and
    a holder provided on the stopper and configured to support the stopper to be combined to the electrolytic condenser,
    wherein the first side of the stopper is spaced apart from the top side of the electrolytic condenser.

2. The explosion-proof apparatus of claim 1, wherein the stopper comprises:
    at least one hole provided in at least one from among the lateral side and the second side of the stopper,
    wherein the at least one hole is smaller in size than the top side of the electrolytic condenser.

3. The explosion-proof apparatus of claim 2, wherein the stopper comprises a plurality of holes, and one of the plurality of holes is larger in size than the other holes.

4. The explosion-proof apparatus of claim 1, wherein the electrolytic condenser, the stopper, and the holder are configured to be provided in a positioning hole formed in a printed circuit board, and
    wherein the holder comprises:
        a body configured to surround the lateral side of the stopper;
        a plurality of first protrusions protruding from the body and configured to be in contact with opposite sides of the positioning hole to apply a pressing force downward to the printed circuit board; and
        a plurality of second protrusions protruding from of the body and configured to be in contact with the opposite sides of the positioning hole to apply a pressing force upward to the printed circuit board.

5. The explosion-proof apparatus of claim 4, wherein the plurality of first protrusions are configured such that a first end of each of the plurality of first protrusions furthest from the body is closer to the printed circuit board than a second end of each of the plurality of first protrusions adjacent to the body when the electrolytic condenser, the stopper, and the holder are provided in the positioning hole.

6. The explosion-proof apparatus of claim 4, wherein the plurality of second protrusions are configured to move toward each other while the electrolytic condenser, the stopper, and the holder are being positioned in the positioning hole, and to move away from each other after the electrolytic condenser, the stopper, and the holder being positioned in the positioning hole.

7. The explosion-proof apparatus of claim 4, wherein the plurality of second protrusions comprise:
    opposite end protrusions formed on opposite ends of the body and configured to be in contact with a first housing located on one side of the printed circuit board; and a central protrusion provided between the opposite end protrusions and configured to be in contact with a second housing located on another side the printed circuit board.

8. The explosion-proof apparatus of claim 4, wherein a first end of each of the plurality of second protrusions furthest away from the body is wider than a second end of each of the plurality of second protrusions closest to the body.

9. The explosion-proof apparatus of claim 4, wherein the positioning hole has a cross shape, and the electrolytic condenser, the stopper, and the holder are provided in the positioning hole in a longitudinal direction of the cross shape, and wherein the plurality of first protrusions and the plurality of second protrusions are configured to be in contact with opposite sides of the cross shape in a lateral direction of the cross shape when the electrolytic condenser, the stopper, and the holder are provided in the positioning hole.

10. The explosion-proof apparatus of claim 4, wherein the holder further comprises:

at least one third protrusion protruding from the body, and
wherein an end of the at least one third protrusion is configured to be in contact with at least one housing configured to secure the printed circuit board.

11. The explosion-proof apparatus of claim 10, wherein the body has a U shape that surrounds a portion of the lateral side of the stopper, and wherein the at least one third protrusion comprises:
a central protrusion provided between the plurality of second protrusions and configured to be in contact with a first housing located one side of the printed circuit board; and
opposite end protrusions formed on opposite ends of the body and configured to be in contact with a second housing located on another side the printed circuit board.

12. The explosion-proof apparatus of claim 1, wherein the electrolytic condenser comprises a spiral groove provided on the lateral side connected to the top side of the electrolytic condenser, wherein the stopper comprises a spiral protrusion corresponding to the spiral groove, and
wherein the electrolytic condenser and the stopper are combined with each other by using the spiral groove and the spiral protrusion.

13. The explosion-proof apparatus of claim 1, further comprising:

a cover member configured to surround the stopper and the lateral side of the electrolytic condenser not being combined with the stopper to secure the stopper to the electrolytic condenser.

14. The explosion-proof apparatus of claim 13, wherein the cover member is coupled with a portion of the electrolytic condenser not being covered with cover vinyl, and is formed of a polymer.

15. The explosion-proof apparatus of claim 13, wherein the cover member is further configured to surround a bottom side, opposite to the top side, of the electrolytic condenser.

16. An explosion-proof apparatus comprising:

an electrolytic condenser comprising an a top side and a spiral groove provided on a lateral side of the electrolytic condenser connected to the top side; and
a stopper having a hollow cylindrical shape that is open at a first side and closed at a second side, opposite to the first side, and configured to be combined with the electrolytic condenser by surrounding the top side of the electrolytic condenser and the lateral side of the electrolytic condenser, through the first side of the stopper;
a cover member, separate from the stopper, configured to surround the stopper and the lateral side of the electrolytic condenser not being combined with the stopper, to secure the stopper to the electrolytic condenser,
wherein a spiral protrusion corresponding to the spiral groove is provided on an inner side of the stopper,
wherein the stopper is configured to be combined with the electrolytic condenser by engaging the spiral protrusion with the spiral groove, and
wherein the first side of the stopper is spaced apart from the top side of the electrolytic condenser.

17. The explosion-proof apparatus of claim 16, wherein the cover member is coupled with the electrolytic condenser not being covered with cover vinyl, and is formed of a polymer.

18. The explosion-proof apparatus of claim 16, wherein the cover member is further configured to surround a bottom side, opposite to the top side, of the electrolytic condenser.

19. The explosion-proof apparatus of claim 16, wherein the stopper comprises at least one hole provided in at least one of a lateral side and the second side of the stopper, and
wherein the at least one hole is smaller in size than the top side of the electrolytic condenser.

* * * * *